United States Patent
Toda et al.

(10) Patent No.: US 9,041,277 B2
(45) Date of Patent: May 26, 2015

(54) LIGHTING DEVICE

(71) Applicant: PANASONIC CORPORATION, Osaka (JP)

(72) Inventors: Naohiro Toda, Osaka (JP); Shin Ukegawa, Kyoto (JP); Makoto Yamada, Osaka (JP); Takashi Saito, Osaka (JP); Shinichi Aoki, Osaka (JP); Hiroki Noguchi, Hyogo (JP); Masaki Ishiwata, Osaka (JP); Sayaka Nishi, Osaka (JP); Ayako Tsukitani, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 13/868,183

(22) Filed: Apr. 23, 2013

(65) Prior Publication Data

US 2013/0300280 A1 Nov. 14, 2013

(30) Foreign Application Priority Data

May 11, 2012 (JP) ................. 2012-110084

(51) Int. Cl.
*H01L 33/50* (2010.01)
*H05B 33/12* (2006.01)

(52) U.S. Cl.
CPC .............. *H05B 33/12* (2013.01); *H01L 33/504* (2013.01)

(58) Field of Classification Search
CPC ............................ H01L 33/502; H01L 33/504
USPC ........................................ 313/498–502, 483
See application file for complete search history.

(56) References Cited

U.S. PATENT DOCUMENTS

| | | | |
|---|---|---|---|
| 8,434,924 B1 * | 5/2013 | Hamburgen et al. | 362/612 |
| 2007/0205711 A1 * | 9/2007 | Takashima et al. | 313/502 |
| 2009/0224652 A1 * | 9/2009 | Li et al. | 313/498 |
| 2010/0157573 A1 | 6/2010 | Toda et al. | |
| 2013/0044456 A1 | 2/2013 | Takei et al. | |
| 2013/0155647 A1 | 6/2013 | Tsukitani et al. | |
| 2013/0313966 A1 * | 11/2013 | Kim et al. | 313/503 |

FOREIGN PATENT DOCUMENTS

| | | |
|---|---|---|
| CN | 101749578 | 6/2010 |
| CN | 102956802 | 3/2013 |
| JP | 2003-228755 | 8/2003 |
| JP | 2007-312631 | 12/2007 |
| JP | 2008-154541 | 7/2008 |
| JP | 2009-152171 | 7/2009 |
| JP | 2009-224148 | 10/2009 |
| JP | 2009-261267 | 11/2009 |
| JP | 4461693 | 5/2010 |

OTHER PUBLICATIONS

U.S. Appl. No. 13/869,122 to Shinichi Aoki et al., filed Apr. 24, 2013.
U.S. Appl. No. 13/911,416 to Sayaka Nishi et al., filed Jun. 6, 2013.
China Office action, dated Mar. 5, 2014 along with an english translation thereof.

* cited by examiner

*Primary Examiner* — Anne Hines
(74) *Attorney, Agent, or Firm* — Greenblum & Bernstein P.L.C.

(57) ABSTRACT

A lighting device includes an LED light source that emits light having a first peak wavelength at 430 to 460 nm and a second peak wavelength at 530 to 570 nm.

7 Claims, 8 Drawing Sheets

Fig.2

|  |  | 1st Peak Wavelength (nm) | 2nd Peak Wavelength (nm) | 3rd Peak Wavelength (nm) | 1st Peak Intensity / 2nd Peak Intensity | 2nd Peak Intensity / 3rd Peak Intensity | Bottom Intensity / 1st Peak Intensity | Ra | Attraction | Attraction Index |
|---|---|---|---|---|---|---|---|---|---|---|
| Example | 1 | 430 | 530 | — | 2.2 | — | <0.01 | 71 | 81 | 94 |
| | 2 | 460 | 550 | — | 1.7 | — | <0.01 | 72 | 80 | 93 |
| | 3 | 455 | 570 | — | 1.7 | — | 0.06 | 70 | 81 | 93 |
| | 4 | 455 | 555 | 650 | 0.8 | 1.1 | 0.06 | 71 | 82 | 94 |
| | 5 | 435 | 530 | 600 | 4.4 | 1.0 | <0.01 | 71 | 80 | 94 |
| | 6 | 450 | 545 | — | 1.2 | — | 0.1 | 73 | 78 | 93 |
| | 7 | 455 | 545 | 620 | 3 | 1.2 | <0.01 | 81 | 78 | 91 |
| | 8 | 455 | 545 | 625 | 1.5 | 1.1 | <0.01 | 81 | 79 | 94 |
| | 9 | 455 | 540 | 620 | 3.7 | 1.2 | 0 | 81 | 71 | 85 |
| | 10 | 455 | 555 | 650 | 0.6 | 1.6 | 0.04 | 60 | 70 | 84 |
| | 11 | 430 | 535 | 600 | 5.3 | 0.9 | <0.01 | 64 | 82 | 92 |
| | 12 | 450 | 555 | — | 1.2 | — | 0.15 | 73 | 91 | 100 |
| | 13 | 455 | 545 | 590 | 3 | 1.1 | <0.01 | 55 | 73 | 87 |
| | 14 | 455 | 545 | 620 | 4.2 | 0.9 | <0.01 | 85 | 92 | 101 |
| Comparative Example | 1 | 425 | 525 | — | 3 | — | <0.01 | 78 | 132 | 130 |
| | 2 | 465 | 575 | — | 2 | — | 0.07 | 67 | 100 | 107 |

LIGHTING DEVICE

CROSS-REFERENCE TO RELATED APPLICATIONS

This application is based upon and claims the benefit of priority from prior Japanese Patent Application No. 2012-110084, filed on May 11, 2012, the entire contents of which are incorporated herein by reference.

BACKGROUND ART

The disclosure relates to a lighting device.

It is generally understood that insects, especially flying insects, are attracted to light having a peak wavelength in the ultraviolet band. Japanese Laid-Open Patent Publication No. 2009-224148 describes an example of a lighting device provided with an LED light source that includes a blue LED element that generates light with less ultraviolet rays. The lighting device attracts less insects as compared with a fluorescent lamp or the like. In addition to the LED light source, which is formed by a blue LED element and a yellow fluorescent body, the lighting device of the above publication include a red LED element that emits red light, which has a longer wavelength than 500 nm.

However, the above publication does not take into consideration color rendering (general color rendering index Ra), which is an index of how the color of an illuminated subject appears. In the above lighting device, the color of the illuminated subject may appear differently from its original color.

SUMMARY

One aspect of the present invention is a lighting device including an LED light source that emits light having a first peak wavelength at 430 to 460 nm and a second peak wavelength at 530 to 570 nm.

Preferably, when an emission intensity at the second peak wavelength is equal to 1, an emission intensity at the first peak wavelength is greater than or equal to 0.8 and less than 5.

Preferably, the light has a bottom wavelength at 460 to 520 nm, and an emission intensity at the bottom wavelength is less than or equal to one tenth of an emission intensity at the first peak wavelength.

Preferably, the LED light source emits the light with the first peak wavelength at 450 to 460 nm, the second peak wavelength at 530 to 560 nm, and a third peak wavelength in a wavelength band of 600 nm or greater. Further, an emission intensity at the first peak wavelength is higher than an emission intensity at the second peak wavelength.

Preferably, the emission intensity at the second peak wavelength is higher than an emission intensity at the third peak wavelength.

Preferably, the LED light source is configured such that the lighting device emits illumination light having a bottom wavelength at 460 to 520 nm and two peaks in a range from 380 to 780 nm, the two peaks having the first peak wavelength at 430 to 460 nm and the second peak wavelength at 530 to 570 nm, wherein an emission intensity at the bottom wavelength is less than or equal to one tenth of an emission intensity at the first peak wavelength.

Preferably, the LED light source is configured such that the lighting device emits illumination light having three emission peaks in a range from 380 to 780 nm and a bottom wavelength at 460 to 520 nm. The three emission peaks have a first peak wavelength at 430 to 460 nm, a second peak wavelength at 530 to 570 nm, and a third peak wavelength at 600 to 780 nm. The ratio of the emission intensity at the first peak wavelength to the emission intensity at the second peak wavelength is greater than or equal to 0.8 and less than 5.

Preferably, the LED light source is configured such that the lighting device emits illumination light having three emission peaks in a range from 380 to 780 nm and a bottom wavelength at 460 to 520 nm. The three emission peaks have a first peak wavelength at 430 to 460 nm, a second peak wavelength at 530 to 570 nm, and a third peak wavelength at 600 to 780 nm. The emission intensity at the second peak wavelength is higher than an emission intensity at the third peak wavelength.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 2 is a chart illustrating illumination light for examples and comparative examples;

DETAILED DESCRIPTION OF EMBODIMENTS

One embodiment of the present invention will now be described.

Figure 1:
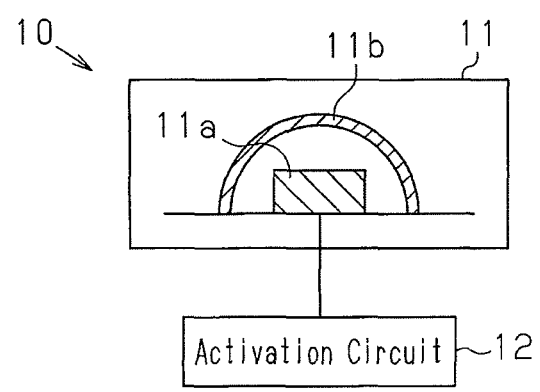
FIG. 1 is a schematic diagram showing one embodiment of a lighting device.

Referring to FIG. 1, a lighting device 10 includes a lighting unit 11, which serves as an LED light source. The lighting unit 11 may be connected to an activation circuit 12 that activates the lighting unit 11. The lighting unit 11 is one example of an LED light source. The activation circuit 12 may be included in the lighting device 10 like in the illustrated example.

The lighting unit 11 may include an LED element 11a, which emits blue light, and a fluorescent body 11b, which covers the LED element 11a. As shown in the drawing, a void may be provided between the fluorescent body 11b and the LED element 11a. The fluorescent body 11b is excited by the light generated by the LED element 11a to emit generally yellow light. The fluorescent body 11b may be, for example, an yttrium aluminum garnet (YAG) fluorescent body. A plurality of fluorescent bodies may be used as the fluorescent body 11b to adjust the peak wavelength and bottom wavelength to desired or target wavelengths. Such fluorescent bodies may include, for example, a green fluorescent body (e.g., CSO) and a red fluorescent body (e.g., CASN).

The lighting unit 11 is activated when supplied with power from the activation circuit 12 to emit generally white light. The lighting device 10 emits the light of the lighting unit as illumination light.

Evaluation Test

The inventors of the present invention conducted tests to evaluate the insect attraction and color rendering properties of some examples of the lighting unit 11.

Example 1

Figure 3:
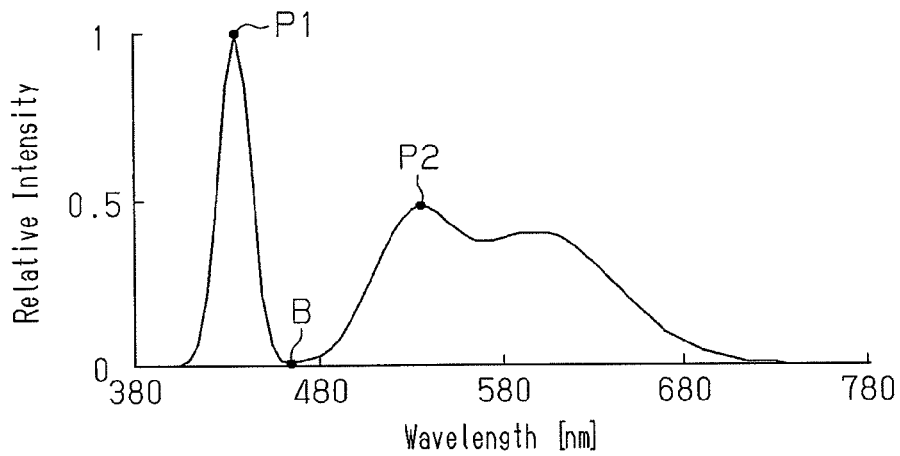
FIG. 3 is an emission spectrum chart for a lighting device of example 1.

Referring to FIG. 2, a lighting unit of example 1 includes a LED element 11a, which generates light having a first peak wavelength P1 at approximately 430 nm. The lighting unit of example 1 emitted light having the first peak wavelength P1 at approximately 430 nm and a second peak wavelength P2 at 530 nm. The ratio of the emission intensity at the first peak wavelength P1 to the emission intensity at the second peak wavelength P2 was 2.2. The light had a bottom wavelength B at the wavelength band of 460 to 520 nm. The ratio of the emission intensity at the bottom wavelength B to the emission intensity at the first peak wavelength P1 was less than 0.01. FIG. 3 shows the spectral chart for the illumination light of example 1.

Example 2

Figure 4:
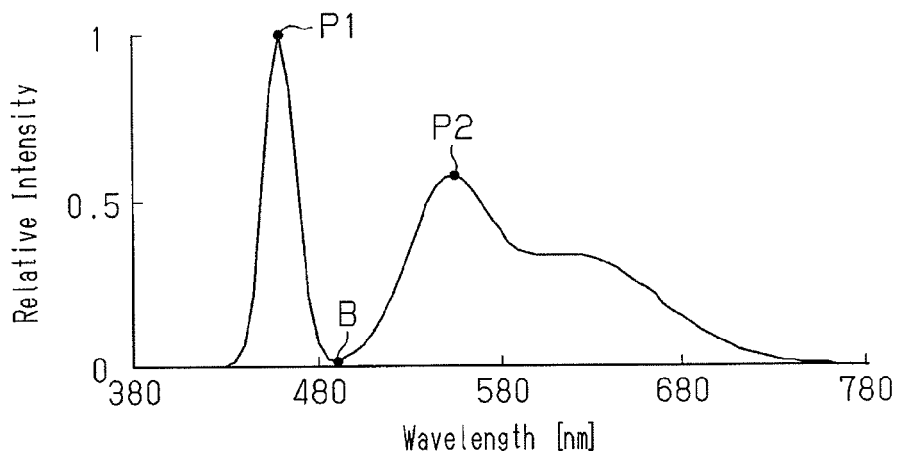
FIG. 4 is an emission spectrum chart for a lighting device of example 2.

A lighting unit of example 2 includes a LED element 11a, which generates light having a first peak wavelength P1 at approximately 460 nm. The lighting unit of example 2 emitted light having the first peak wavelength P1 at approximately 460 nm and a second peak wavelength P2 at 550 nm. The ratio of the emission intensity at the first peak wavelength P1 to the emission intensity at the second peak wavelength P2 was 1.7. The light had a bottom wavelength B at the wavelength band of 460 to 520 nm. The ratio of the emission intensity at the bottom wavelength B to the emission intensity at the first peak wavelength P1 was less than 0.01. FIG. 4 shows the spectral chart for the illumination light of example 2.

Example 3

Figure 5:
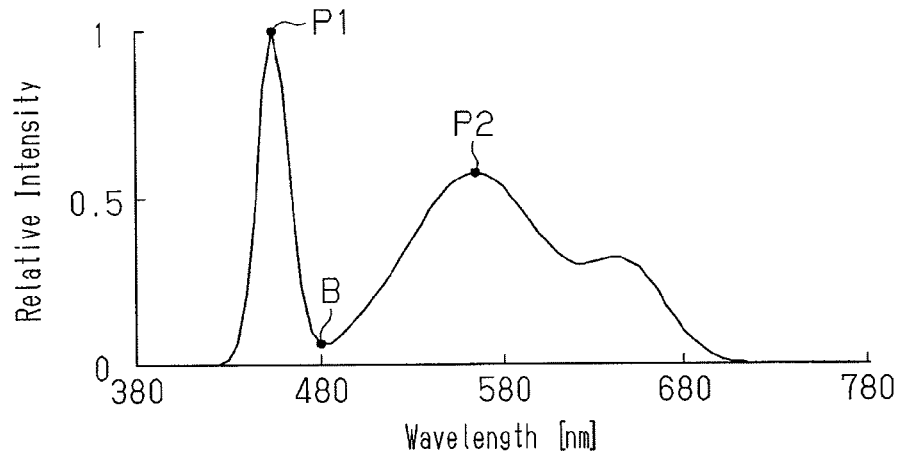
FIG. 5 is an emission spectrum chart for a lighting device of example 3.

A lighting unit of example 3 includes a LED element 11a, which generates light having a first peak wavelength P1 at approximately 455 nm. The lighting unit of example 3 emitted light having the first peak wavelength P1 at approximately 455 nm and a second peak wavelength P2 at 570 nm. The ratio of the emission intensity at the first peak wavelength P1 to the emission intensity at the second peak wavelength P2 was 1.7. The light had a bottom wavelength B at the wavelength band of 460 to 520 nm. The ratio of the emission intensity at the bottom wavelength B to the emission intensity at the first peak wavelength P1 was 0.06. FIG. 5 shows the spectral chart for the illumination light of example 3.

Example 4

Figure 6:
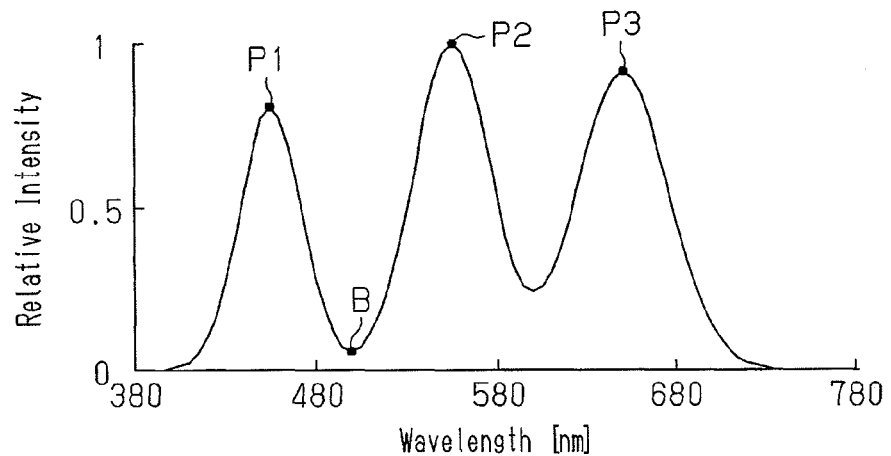
FIG. 6 is an emission spectrum chart for a lighting device of example 4.

A lighting unit of example 4 includes a LED element 11a, which generates light having a first peak wavelength P1 at approximately 455 nm. The lighting unit of example 4 emitted light having the first peak wavelength P1 at approximately 455 nm, a second peak wavelength P2 at 555 nm, and a third peak wavelength P3 at 650 nm. The ratio of the emission intensity at the first peak wavelength P1 to the emission intensity at the second peak wavelength P2 was 0.8. The ratio of the emission intensity at the second peak wavelength P2 to the emission intensity at the third peak wavelength P3 was 1.1. The light had a bottom wavelength B at the wavelength band of 460 to 520 nm. The ratio of the emission intensity at the bottom wavelength B to the emission intensity at the first peak wavelength P1 was 0.06. FIG. 6 shows the spectral chart for the illumination light of example 4.

Example 5

Figure 7:
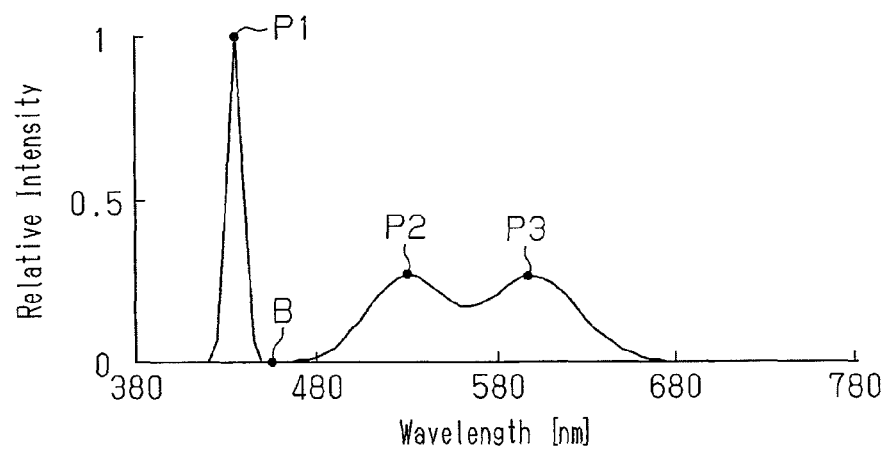
FIG. 7 is an emission spectrum chart for a lighting device of example 5.

A lighting unit of example 5 includes a LED element 11a, which generates light having a first peak wavelength P1 at approximately 435 nm. The lighting unit of example 5 emitted light having the first peak wavelength P1 at approximately 435 nm, a second peak wavelength P2 at 530 nm, and a third peak wavelength P3 at 600 nm. The ratio of the emission intensity at the first peak wavelength P1 to the emission intensity at the second peak wavelength P2 was 4.4. The ratio of the emission intensity at the second peak wavelength P2 to the emission intensity at the third peak wavelength P3 was 1.0. The light had a bottom wavelength B at the wavelength band of 460 to 520 nm. The ratio of the emission intensity at the bottom wavelength B to the emission intensity at the first peak wavelength P1 was less than 0.01. FIG. 7 shows the spectral chart for the illumination light of example 5.

Example 6

Figure 8:
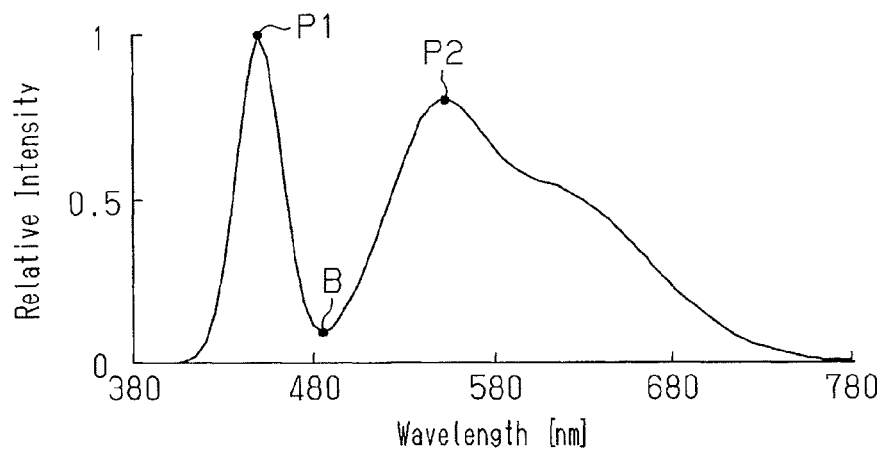
FIG. 8 is an emission spectrum chart for a lighting device of example 6.

A lighting unit of example 6 includes a LED element 11a, which generates light having a first peak wavelength P1 at approximately 450 nm. The lighting unit of example 6 emitted light having the first peak wavelength P1 at approximately 450 nm and a second peak wavelength P2 at 545 nm. The ratio of the emission intensity at the first peak wavelength P1 to the emission intensity at the second peak wavelength P2 was 1.2. The light had a bottom wavelength B at the wavelength band of 460 to 520 nm. The ratio of the emission intensity at the bottom wavelength B to the emission intensity at the first peak wavelength P1 was 0.1. FIG. 8 shows the spectral chart for the illumination light of example 6.

Example 7

Figure 9:
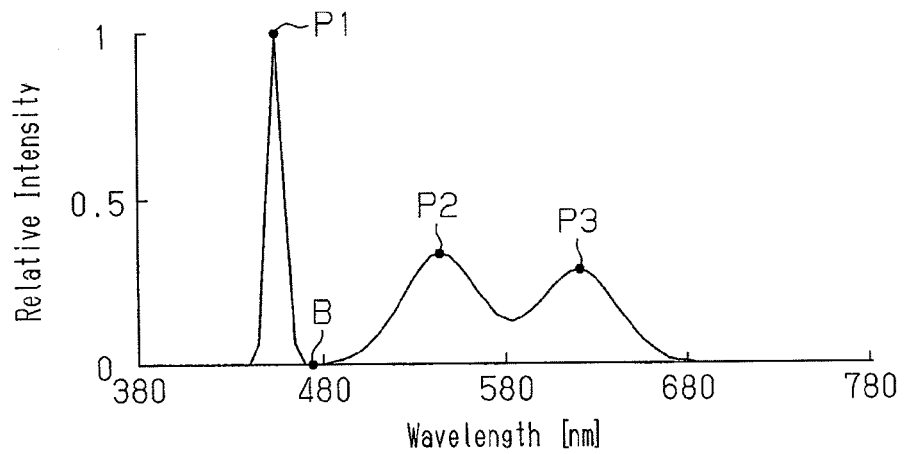
FIG. 9 is an emission spectrum chart for a lighting device of example 7.

A lighting unit of example 7 includes a LED element 11a, which generates light having a first peak wavelength P1 at approximately 455 nm. The lighting unit of example 7 emitted light having the first peak wavelength P1 at approximately 455 nm, a second peak wavelength P2 at 545 nm, and a third peak wavelength P3 at 620 nm. The ratio of the emission intensity at the first peak wavelength P1 to the emission intensity at the second peak wavelength P2 was 3. The ratio of the emission intensity at the second peak wavelength P2 to the emission intensity at the third peak wavelength P3 was 1.2. The light had a bottom wavelength B at the wavelength band of 460 to 520 nm. The ratio of the emission intensity at the bottom wavelength B to the emission intensity at the first peak wavelength P1 was less than 0.01. FIG. 9 shows the spectral chart for the illumination light of example 7.

Example 8

Figure 10:
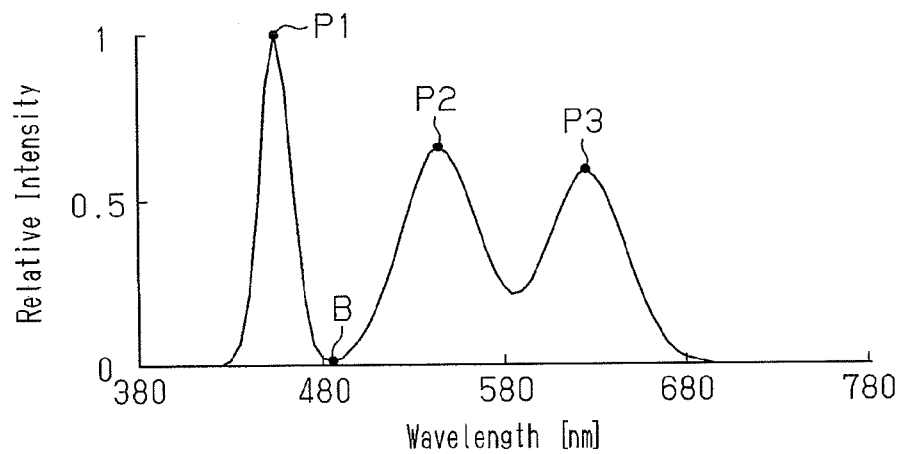
FIG. 10 is an emission spectrum chart for a lighting device of example 8.

A lighting unit of example 8 includes a LED element 11a, which generates light having a first peak wavelength P1 at approximately 455 nm. The lighting unit of example 8 emitted light having the first peak wavelength P1 at approximately 455 nm, a second peak wavelength P2 at 545 nm, and a third peak wavelength P3 at 625 nm. The ratio of the emission intensity at the first peak wavelength P1 to the emission intensity at the second peak wavelength P2 was 1.5. The ratio of the emission intensity at the second peak wavelength P2 to the emission intensity at the third peak wavelength P3 was 1.1. The light had a bottom wavelength B at the wavelength band of 460 to 520 nm. The ratio of the emission intensity at the bottom wavelength B to the emission intensity at the first peak wavelength P1 was less than 0.01. FIG. 10 shows the spectral chart for the illumination light of example 8.

Example 9

Figure 11:
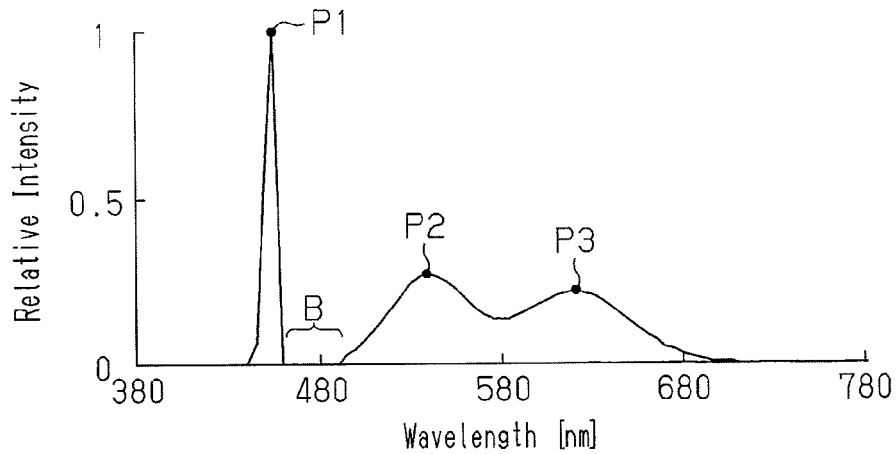
FIG. 11 is an emission spectrum chart for a lighting device of example 9.

A lighting unit of example 9 includes a LED element 11a, which generates light having a first peak wavelength P1 at approximately 455 nm. The lighting unit of example 9 emitted light having the first peak wavelength P1 at approximately 455 nm, a second peak wavelength P2 at 540 nm, and a third peak wavelength P3 at 620 nm. The ratio of the emission intensity at the first peak wavelength P1 to the emission intensity at the second peak wavelength P2 was 3.7. The ratio of the emission intensity at the second peak wavelength P2 to the emission intensity at the third peak wavelength P3 was 1.2. The light had a bottom wavelength B at the wavelength band of 460 to 520 nm. The ratio of the emission intensity at the bottom wavelength B to the emission intensity at the first peak wavelength P1 was 0. FIG. 11 shows the spectral chart for the illumination light of example 8.

Comparative Example 1

Figure 12:
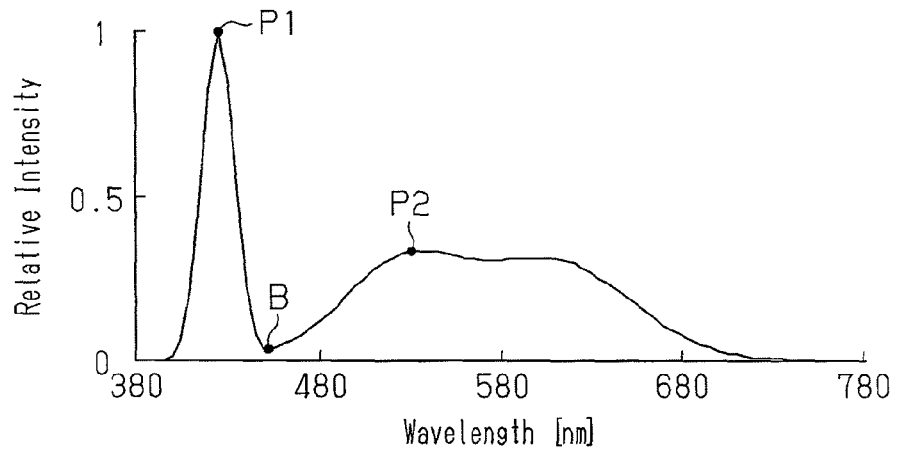
FIG. 12 is an emission spectrum chart for a lighting device of comparative example 1.

A lighting unit of comparative example 1 includes a LED element 11a, which generates light having a first peak wavelength P1 at approximately 425 nm. The lighting unit of comparative example 1 emitted light having the first peak wavelength P1 at 425 nm and a second peak wavelength P2 at 525 nm. The ratio of the emission intensity at the first peak wavelength P1 to the emission intensity at the second peak wavelength P2 was 3. The light had a bottom wavelength B at the wavelength band of 460 to 520 nm. The ratio of the emission intensity at the bottom wavelength B to the emission intensity at the first peak wavelength P1 was less than 0.01. FIG. 12 shows the spectral chart for the illumination light of comparative example 1.

Comparative Example 2

Figure 13:
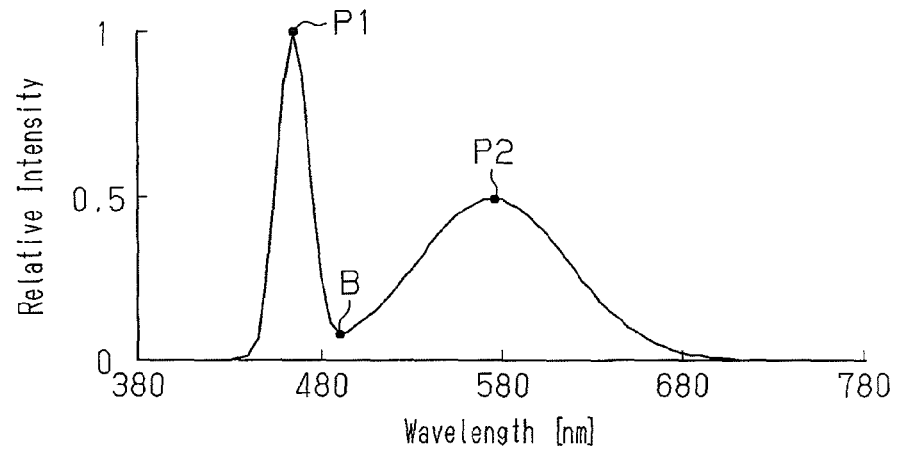
FIG. 13 is an emission spectrum chart for a lighting device of comparative example 2.

A lighting unit of comparative example 2 includes a LED element 11a, which generates light having a first peak wavelength P1 at approximately 465 nm. The lighting unit of comparative example 2 emitted light having the first peak wavelength P1 at approximately 465 nm and a second peak wavelength P2 at 575 nm. The ratio of the emission intensity at the first peak wavelength P1 to the emission intensity at the second peak wavelength P2 was 2. The light had a bottom wavelength B at the wavelength band of 460 to 520 nm. The ratio of the emission intensity at the bottom wavelength B to the emission intensity at the first peak wavelength P1 was 0.07. FIG. 13 shows the spectral chart for the illumination light of comparative example 2.

Example 10

Figure 14:
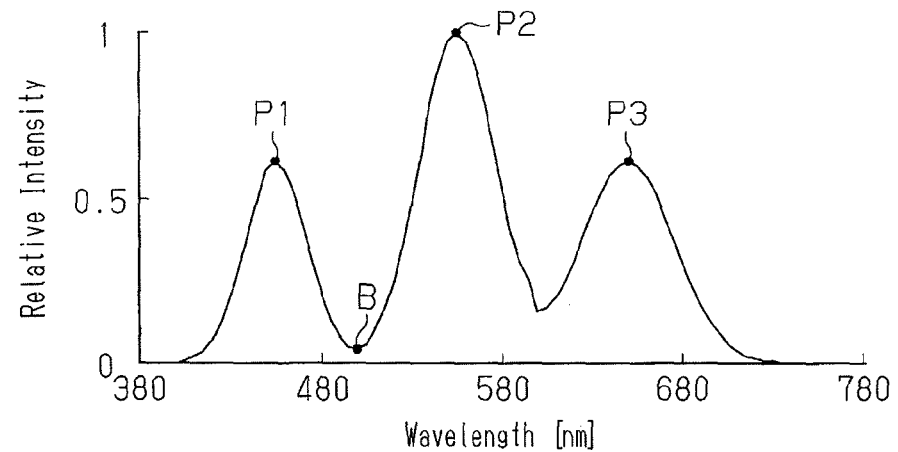
FIG. 14 is an emission spectrum chart for a lighting device of example 10.

A lighting unit of example 10 includes a LED element 11a, which generates light having a first peak wavelength P1 at approximately 455 nm. The lighting unit of example 10 emitted light having the first peak wavelength P1 at approximately 455 nm, a second peak wavelength P2 at 555 nm, and a third peak wavelength P3 at 650 nm. The ratio of the emission intensity at the first peak wavelength P1 to the emission intensity at the second peak wavelength P2 was 0.6. The ratio of the emission intensity at the second peak wavelength P2 to the emission intensity at the third peak wavelength P3 was 1.6. The light had a bottom wavelength B at the wavelength band of 460 to 520 nm. The ratio of the emission intensity at the bottom wavelength B to the emission intensity at the first peak wavelength P1 was 0.04. FIG. 14 shows the spectral chart for the illumination light of example 10.

Example 11

Figure 15:
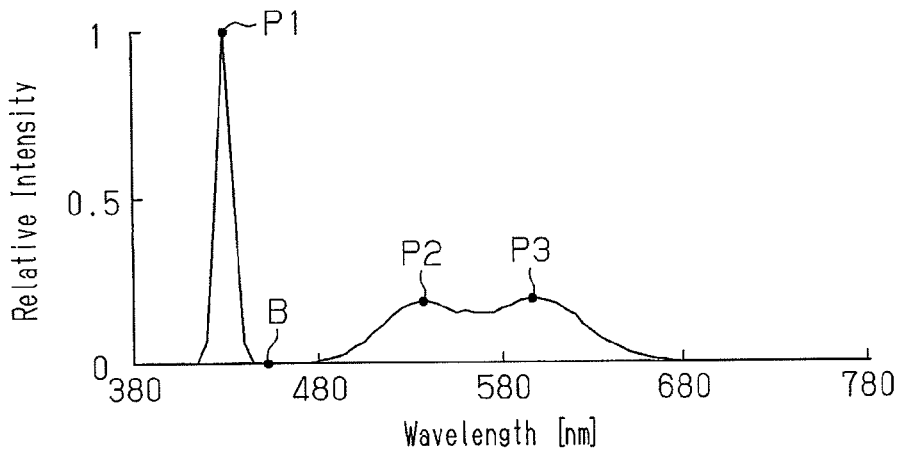
FIG. 15 is an emission spectrum chart for a lighting device of example 11.

A lighting unit of example 11 includes a LED element 11a, which generates light having a first peak wavelength P1 at approximately 430 nm. The lighting unit of example 11 emitted light having a first peak wavelength P1 at approximately 430 nm, a second peak wavelength P2 at 535 nm, and a third peak wavelength P3 at 600 nm. The ratio of the emission intensity at the first peak wavelength P1 to the emission intensity at the second peak wavelength P2 was 5.3. The ratio of the emission intensity at the second peak wavelength P2 to the emission intensity at the third peak wavelength P3 was 0.9. The light had a bottom wavelength B at the wavelength band of 460 to 520 nm. The ratio of the emission intensity at the bottom wavelength B to the emission intensity at the first peak wavelength P1 was less than 0.01. FIG. 15 shows the spectral chart for the illumination light of example 11.

Example 12

Figure 16:
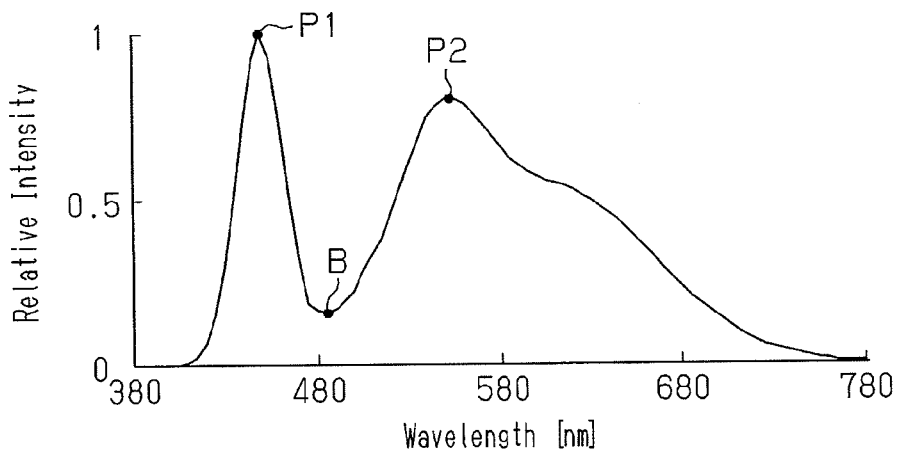
FIG. 16 is an emission spectrum chart for a lighting device of example 12.

A lighting unit of example 12 includes a LED element 11a, which generates light having a first peak wavelength P1 at approximately 450 nm. The lighting unit of example 12 emitted light having the first peak wavelength P1 at approximately 450 nm and a second peak wavelength P2 at 555 nm. The ratio of the emission intensity at the first peak wavelength P1 to the emission intensity at the second peak wavelength P2 was 1.2. The light had a bottom wavelength B at the wavelength band of 460 to 520 nm. The ratio of the emission intensity at the bottom wavelength B to the emission intensity at the first peak wavelength P1 was 0.15. FIG. 16 shows the spectral chart for the illumination light of example 12.

Example 13

Figure 17:
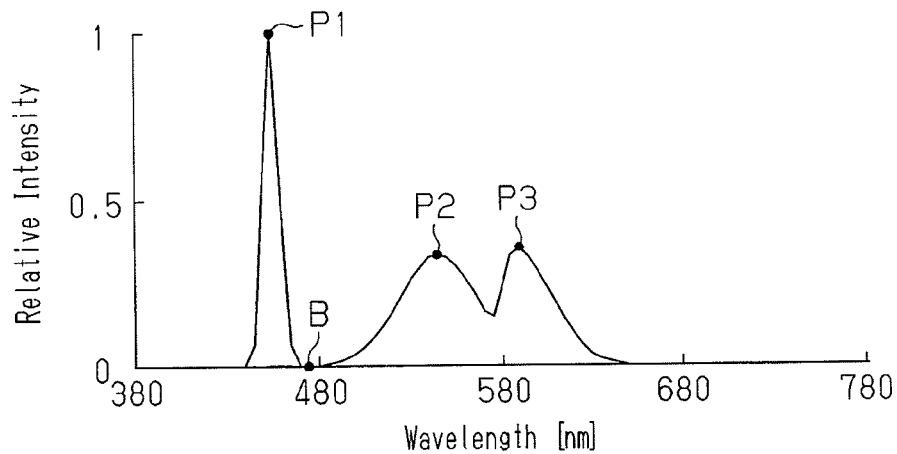
FIG. 17 is an emission spectrum chart for a lighting device of example 13.

A lighting unit of example 13 includes a LED element 11a, which generates light having a first peak wavelength P1 at approximately 455 nm. The lighting unit of example 13 emitted light having the first peak wavelength P1 at approximately 455 nm, a second peak wavelength P2 at 545 nm, and a third peak wavelength P3 at 590 nm. The ratio of the emission intensity at the first peak wavelength P1 to the emission intensity at the second peak wavelength P2 was 3. The ratio of the emission intensity at the second peak wavelength P2 to the emission intensity at the third peak wavelength P3 was 1.1. The light had a bottom wavelength B at the wavelength band of 460 to 520 nm. The ratio of the emission intensity at the bottom wavelength B to the emission intensity at the first peak wavelength P1 was less than 0.01. FIG. 17 shows the spectral chart for the illumination light of example 13.

Example 14

Figure 18:
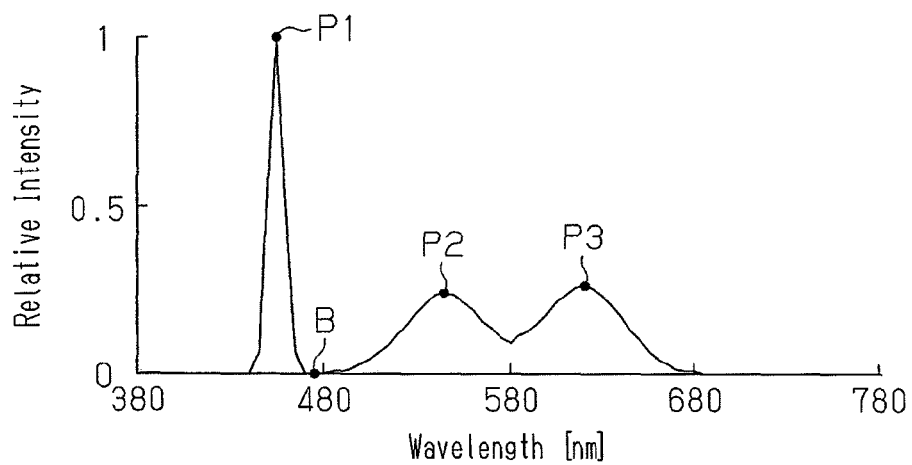
FIG. 18 is an emission spectrum chart for a lighting device of example 14.

A lighting unit of example 14 includes a LED element 11a, which generates light having a first peak wavelength P1 at approximately 455 nm. The lighting unit of example 14 emitted light having the first peak wavelength P1 at approximately 455 nm, a second peak wavelength P2 at 545 nm, and a third peak wavelength P3 at 620 nm. The ratio of the emission intensity at the first peak wavelength P1 to the emission intensity at the second peak wavelength P2 was 4.2. The ratio of the emission intensity at the second peak wavelength P2 to the emission intensity at the third peak wavelength P3 was 0.9. The light had a bottom wavelength B at the wavelength band of 460 to 520 nm. The ratio of the emission intensity at the bottom wavelength B to the emission intensity at the first peak wavelength P1 was less than 0.01. FIG. 18 shows the spectral chart for the illumination light of example 14.

Figure 19A:
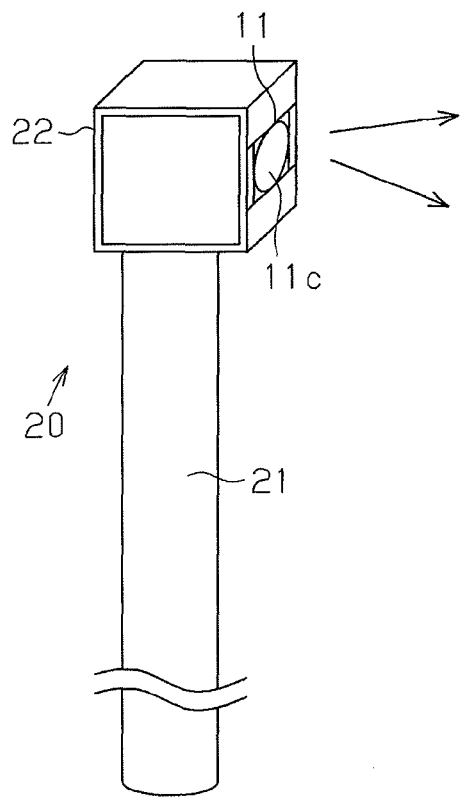
FIGS. 19A and 19B are schematic diagrams of an evaluation device.
Figure 19B:
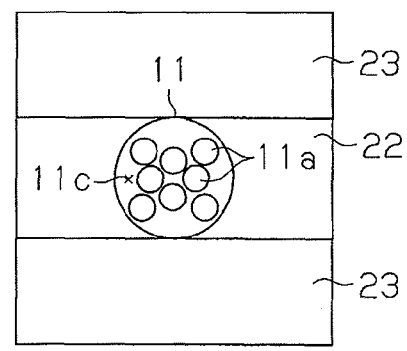

Evaluation tests were conducted on examples 1 to 14 and comparative examples 1 and 2. An evaluation device 20 shown in FIG. 19A was used to conduct the evaluation tests. Referring to FIG. 19B, the evaluation device 20 includes the lighting unit 11, which is accommodated in a generally box-shaped accommodation portion 22 coupled to the upper end of a pole 21. The lighting unit 11 includes a light emission surface 11c that is visible from one side of the accommodation portion 22. Adhesive traps 23 are arranged above and below the light emission surface 11c of the lighting unit 11 in the accommodation portion 22. An adhesive agent is applied to the surface of each adhesive trap 23, the dimensions of which are 200 mm×500 mm.

The spectral characteristics of the lighting unit 11 were adjusted in accordance with examples 1 to 14 and comparative examples 1 and 2. For example, a down light (type NNN21615) manufactured by Panasonic Electric Works Co., Ltd. may be used as the electrical and mechanical part of the lighting unit 11.

The evaluation device 20 was arranged in a 10 m×10 m room and activated to emit light with three kinds of insects (flies, diamondback moths, and the like), 400 each, released in the room for one hour. Then, the number of insects caught on the adhesive traps 23 was counted. In FIG. 2, the insect attraction uses the number of insects caught by comparative example 2 as a standard, or reference value (100), to indicate the number of insects caught by each example and comparative example.

In addition to the insect attraction, an insect attraction index was calculated from the spectrum of each of examples 1 to 9 and comparative examples 1 to 3 based on Matsushita Denki Sangyo Kenkyujo Technical Publication, "Lighting and Insects", published in December, 1975. Further, the general color rendering index Ra was calculated from the spectrum of each of examples and comparative examples based on JIS Z8726.

Evaluation of Examples 1 to 14

Referring to FIG. 2, the lighting units 11 of examples 1 to 14 each have a first peak wavelength P1 in the range from 430 nm to 460 nm, and a second peak wavelength P2 in the range from 530 to 570 nm. Further, examples 1 to 14 each have a relatively low insect attraction (insect attraction index) and a relatively high general color rendering index Ra.

In contrast, comparative example 1 has an insect attraction of 132 (insect attraction index 130), which is significantly higher than examples 1 to 14, and is thus not desirable. Comparative example 2 has a relatively high insect attraction (insect attraction index). Further, comparative example 2 has a relatively low general color rendering index Ra of less than 70. Thus, comparative example 2 is not desirable.

Examples 1 to 9 each have a relatively low insect attraction (insect attraction index) or a relatively high general color rendering index Ra and are thus more preferable.

The examples and comparative examples show that when the lighting unit 11 has a first peak wavelength P1 in 430 to 460 nm and a second peak wavelength P2 in 530 nm to 570 nm, the insect attraction index is 95 or less, the general color rendering index Ra is relatively high, and color rendering is ensured while decreasing insect attraction. The light of the lighting unit 11 may have a third peak wavelength in the wavelength band of 600 nm or greater like in examples 4, 5, and 7 to 9.

In addition to the above configuration, the ratio of the emission intensity at the first peak wavelength P1 to the emission intensity at the second peak wavelength P2 is preferably greater than or equal to 0.8 and less than 5. This configuration obtains a general color rendering index of 70 or greater. Further, this configuration allows for a high general color rendering index Ra to be maintained in comparison with when the ratio of the emission intensity at the first peak wavelength P1 to the emission intensity at the second peak wavelength P2 is less than 0.8 or greater than or equal to 5 (examples 10 and 11).

As apparent from examples 1 to 9, in addition to the above configuration, preferably, the light has a bottom wavelength of 460 to 520 nm, and the emission intensity at the bottom wavelength is less than or equal to one tenth of the emission intensity at the first peak wavelength, that is, the ratio of the emission intensity at the bottom wavelength B to the emission intensity at the first peak wavelength P1 is less than or equal to 0.1. This configuration allows the insect attraction index to be 95 or less. Further, this structure allows for the insect attraction index to be decreased in comparison with when the ratio of the emission intensity at the bottom wavelength B to the emission intensity at the first peak wavelength P1 is greater than 0.1 (example 12).

As apparent from examples 7 to 9, preferably, the lighting unit 11 emits light having a first peak wavelength in the range from 450 to 460 nm, a second peak wavelength in the range from 530 to 560 nm, and a third peak wavelength in the wavelength band of 600 nm or greater. Preferably, the emission intensity at the first peak wavelength P1 is higher than the emission intensity at the second peak wavelength P2, and the emission intensity at the second peak wavelength P2 is higher than the emission intensity at the third peak wavelength P3. This configuration allows for a general color rendering index Ra of 80 or greater to be obtained. Further, such a configuration maintains a high general color rendering index Ra in comparison with when the third peak wavelength P3 is less than 600 nm. Further, this configuration allows for the insect attraction index to be decreased in comparison with when the emission intensity at the third peak wavelength P3 is higher than the emission intensity at the second peak wavelength P2.

As shown by the spectral chart for each embodiment, a single valley is located between the first peak wavelength and the second peak wavelength, and the valley does not include any peaks. Further, the range from the first peak wavelength to at least 380 nm also does not include any peaks.

The present embodiment has the advantages described below.

(1) The lighting unit 11 emits light having a first peak wavelength P1 at 430 to 460 nm and a second peak wavelength P2 at 530 to 570 nm. As shown in FIG. 2, this allows for an insect attraction index of 95 or less and a relatively high general color rendering index Ra to be obtained. This decreases insect attraction and ensures color rendering.

(2) Preferably, the ratio of the emission intensity at the first peak wavelength P1 to the emission intensity at the second peak wavelength P2 is greater than or equal to 0.8 and less than 5. This configuration obtains a general color rendering index of 70 or greater. Further, this configuration allows for a high general color rendering index Ra to be maintained in comparison with when the ratio of the emission intensity at the first peak wavelength P1 to the emission intensity at the second peak wavelength P2 is less than 0.8 or greater than or equal to 5 (example 10 and example 11).

(3) Preferably, the light of the lighting unit 11 has a bottom wavelength of 460 to 520 nm, and the emission intensity at the bottom wavelength is less than or equal to one tenth of the emission intensity at the first peak wavelength, that is, the ratio of the emission intensity at the bottom wavelength B to the emission intensity at the first peak wavelength P1 is less than or equal to 0.1. This configuration allows the insect attraction index to be 95 or less. Further, this configuration allows for the insect attraction index to be decreased in comparison with when the ratio of the emission intensity at the bottom wavelength B to the emission intensity at the first peak wavelength P1 is greater than 0.1 (example 12).

(4) Preferably, the lighting unit 11 emits light having a first peak wavelength in the range from 450 to 460 nm, a second peak wavelength in the range from 530 to 560 nm, and a third peak wavelength in the wavelength band of 600 nm or greater. Preferably, the emission intensity at the first peak wavelength P1 is higher than the emission intensity at the second peak wavelength P2. This configuration allows for a general color rendering index Ra of 80 or greater to be obtained. Further, such a configuration maintains a high general color rendering index Ra in comparison with when the third peak wavelength P3 is less than 600 nm.

(5) Preferably, the emission intensity at the second peak wavelength P2 is higher than the emission intensity at the third peak wavelength P3. This configuration allows for the insect attraction index to be decreased in comparison with when the emission intensity at the third peak wavelength P3 is higher than the emission intensity at the second peak wavelength P2.

(6) Preferably, the light of the lighting unit 11 has a bottom wavelength B at 460 to 490 nm, and the emission intensity at the bottom wavelength B is 0. This configuration further decreases the insect attraction index.

The above embodiment may be modified as described below.

In the above embodiment, the lighting unit 11 includes the single LED element 11a and the fluorescent body 11b. However, the structure of the lighting unit 11 may be changed in accordance with the specification of the lighting unit 11.

It should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

The invention claimed is:

1. A lighting device comprising:
    an LED light source configured to emit light having a first peak wavelength at 430 to 460 nm, a second peak wavelength at 530 to 570 nm, and a third peak wavelength in a wavelength band of 600 nm or greater,
    wherein an emission intensity at the second peak wavelength is higher than an emission intensity at the third leak wavelength and a ratio of an emission intensity at a bottom wavelength at 460 to 520 nm to the emission intensity at the first peak wavelength is equal to or less than 0.06.

2. The lighting device according to claim 1, wherein when the emission intensity at the second peak wavelength is equal to 1, an emission intensity at the first peak wavelength is greater than or equal to 0.8 and less than 5.

3. The lighting device according to claim 1, wherein
    the LED light source emits the light with the first peak wavelength at 450 to 460 nm, the second peak wavelength at 530 to 560 nm, and
    an emission intensity at the first peak wavelength is higher than the emission intensity at the second peak wavelength.

4. The lighting device according to claim 1, wherein the LED light source is configured such that the lighting device emits illumination light having two peaks in a range from 380 to 780 nm, the two peaks having the first peak wavelength at 430 to 460 nm and the second peak wavelength at 530 to 570 nm.

5. The lighting device according to claim 1, wherein the LED light source is configured such that the lighting device emits illumination light having three emission peaks in a range from 380 to 780 nm
    third peak wavelength is at 600 to 780 nm, and
    a ratio of an emission intensity at the first peak wavelength to the emission intensity at the second peak wavelength is greater than or equal to 0.8 and less than 5.

6. A lighting device comprising:
    an LED light source configured to emit light having a first peak wavelength at 430 to 460 nm and a second peak wavelength at 530 to 570 nm,
    wherein the light of the LED light source has a bottom wavelength at 460 to 490 nm, and an emission intensity at the bottom wavelength is 0, and an emission intensity at the first peak wavelength is greater than an emission intensity at the second peak wavelength.

7. A lighting device comprising:
    an LED light source,
    wherein the LED light source is configured such that the lighting device emits illumination light having three emission peaks in a range from 380 to 780 nm and a bottom wavelength at 460 to 520 nm, wherein
    the three emission peaks have a first peak wavelength at 430 to 460 nm, a second peak wavelength at 530 to 570 nm, and a third peak wavelength at 600 to 780 nm,
    an emission intensity at the second peak wavelength is higher than an emission intensity at the third peak wavelength, and
    a ratio of an emission intensity at a bottom wavelength at 460 to 520 nm to the emission intensity at the first peak wavelength is equal to or less than 0.06.

* * * * *